United States Patent
Ioannou et al.

(10) Patent No.: US 9,640,228 B2
(45) Date of Patent: May 2, 2017

(54) CMOS DEVICE WITH READING CIRCUIT

(71) Applicant: INTERNATIONAL BUSINESS MACHINES CORPORATION, Armonk, NY (US)

(72) Inventors: Dimitris P. Ioannou, South Burlington, VT (US); Chandrasekharan Kothandaraman, Hopewell Junction, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 69 days.

(21) Appl. No.: 14/568,966

(22) Filed: Dec. 12, 2014

(65) Prior Publication Data

US 2016/0172011 A1    Jun. 16, 2016

(51) Int. Cl.
| | |
|---|---|
| G06F 17/50 | (2006.01) |
| G11C 7/04 | (2006.01) |
| G11C 7/24 | (2006.01) |
| G11C 11/412 | (2006.01) |
| H01L 29/78 | (2006.01) |
| G11C 16/10 | (2006.01) |
| G06F 9/30 | (2006.01) |
| H01L 29/423 | (2006.01) |

(52) U.S. Cl.
CPC ............... *G11C 7/04* (2013.01); *G11C 7/24* (2013.01); *G11C 11/412* (2013.01); *G06F 9/30141* (2013.01); *G11C 16/10* (2013.01); *H01L 29/42368* (2013.01); *H01L 29/7815* (2013.01)

(58) Field of Classification Search
CPC .. G06F 9/30141; H01L 29/42368; G11C 7/00
See application file for complete search history.

(56) References Cited

U.S. PATENT DOCUMENTS

| | | | | |
|---|---|---|---|---|
| 3,651,492 A | * | 3/1972 | Lockwood | G11C 16/0466 327/208 |
| 4,139,911 A | * | 2/1979 | Sciulli | G11C 16/28 327/51 |

(Continued)

FOREIGN PATENT DOCUMENTS

WO    2009024913    2/2009

OTHER PUBLICATIONS

Fischer et al.; "A 65nm test structure for the analysis of NBTI induced statistical variation in SRAM transistors"; Year: 2008; ESSDERC 2008—38th European Solid-State Device Research Conference; pp. 51-54.*

(Continued)

*Primary Examiner* — Helen Rossoshek
(74) *Attorney, Agent, or Firm* — Anthony Canale; Andrew M. Calderon; Roberts Mlotkowski Safran Cole & Calderon, P.C.

(57) ABSTRACT

Methods and devices for providing unclonable chip identification are provided. An integrated circuit device includes: a first transistor having a first gate oxide thickness; a second transistor having a second gate oxide thickness different than the first gate oxide thickness; and a reading circuit connected to the first transistor and the second transistor, wherein the reading circuit reads a difference in threshold voltage between the first transistor and the second transistor.

20 Claims, 4 Drawing Sheets

(56) References Cited

U.S. PATENT DOCUMENTS

| | | | | |
|---|---|---|---|---|
| 5,463,587 | A * | 10/1995 | Maruyama | G11C 16/14 |
| | | | | 365/184 |
| 5,604,700 | A * | 2/1997 | Parris | H01L 27/115 |
| | | | | 257/E27.103 |
| 5,867,423 | A * | 2/1999 | Kapoor | G11C 11/5692 |
| | | | | 365/168 |
| 6,020,241 | A * | 2/2000 | You | H01L 27/1126 |
| | | | | 257/390 |
| 6,433,609 | B1 * | 8/2002 | Voldman | H03K 5/08 |
| | | | | 327/313 |
| 6,476,414 | B1 * | 11/2002 | Sekine | H01L 22/34 |
| | | | | 257/288 |
| 6,574,160 | B1 * | 6/2003 | Eleyan | G11C 7/04 |
| | | | | 365/205 |
| 6,634,004 | B1 * | 10/2003 | Yamada | G11C 29/50004 |
| | | | | 714/42 |
| 6,686,604 | B2 * | 2/2004 | Layman | H01L 21/82343 |
| | | | | 257/192 |
| 7,170,809 | B2 * | 1/2007 | Joshi | G11C 11/417 |
| | | | | 365/154 |
| 7,472,322 | B1 * | 12/2008 | Ma | G01R 31/2621 |
| | | | | 438/234 |
| 7,482,657 | B1 | 1/2009 | Lucero | |
| 7,512,007 | B2 * | 3/2009 | Terasawa | G11C 16/0466 |
| | | | | 365/185.18 |
| 7,659,769 | B2 * | 2/2010 | Nakaya | G11C 5/146 |
| | | | | 327/534 |
| 7,675,769 | B2 * | 3/2010 | Sumita | G06F 9/30141 |
| | | | | 365/154 |
| 7,759,238 | B2 * | 7/2010 | Chen | H01L 21/02233 |
| | | | | 257/638 |
| 7,800,171 | B2 * | 9/2010 | Von Borcke | H01L 29/7813 |
| | | | | 257/330 |
| 7,835,196 | B2 * | 11/2010 | Noda | G11C 11/412 |
| | | | | 365/185.12 |
| 7,859,340 | B2 * | 12/2010 | Miao | H03F 1/14 |
| | | | | 330/253 |
| 7,915,603 | B2 * | 3/2011 | Kreupl | G11C 13/0004 |
| | | | | 257/148 |
| 8,107,309 | B2 | 1/2012 | Dewanz et al. | |
| 8,242,496 | B2 * | 8/2012 | Yamazaki | H01L 27/1251 |
| | | | | 257/43 |
| 8,378,343 | B2 * | 2/2013 | Yamazaki | H01L 27/124 |
| | | | | 257/43 |
| 8,432,751 | B2 | 4/2013 | Hafez et al. | |
| 8,445,905 | B2 * | 5/2013 | Yamazaki | H01L 27/1251 |
| | | | | 257/43 |
| 8,619,979 | B2 | 12/2013 | Ficke et al. | |
| 8,700,916 | B2 | 4/2014 | Bell et al. | |
| 8,741,713 | B2 | 6/2014 | Bruley et al. | |
| 2002/0047140 | A1 * | 4/2002 | Moller | H01L 21/26586 |
| | | | | 257/262 |
| 2002/0195563 | A1 * | 12/2002 | Iida | H01L 27/14634 |
| | | | | 250/332 |
| 2003/0160715 | A1 * | 8/2003 | Maeda | H01L 23/57 |
| | | | | 341/144 |
| 2004/0053429 | A1 * | 3/2004 | Muranaka | G05B 19/128 |
| | | | | 438/17 |
| 2005/0001682 | A1 * | 1/2005 | May | H03F 3/45192 |
| | | | | 330/253 |
| 2005/0266644 | A1 * | 12/2005 | Matsumoto | H01L 21/82346 |
| | | | | 438/275 |
| 2006/0034133 | A1 * | 2/2006 | Sekiguchi | G11O 5/063 |
| | | | | 365/190 |
| 2006/0256605 | A1 * | 11/2006 | Joshi | G11C 11/417 |
| | | | | 365/100 |
| 2007/0025170 | A1 * | 2/2007 | Barth | G11C 7/02 |
| | | | | 365/208 |
| 2008/0062779 | A1 * | 3/2008 | Sumita | G06F 9/30141 |
| | | | | 365/189.16 |
| 2008/0088355 | A1 * | 4/2008 | Von Borcke | H03K 17/687 |
| | | | | 327/436 |
| 2008/0099827 | A1 * | 5/2008 | Kreupl | G11C 13/0004 |
| | | | | 257/324 |
| 2008/0151604 | A1 * | 6/2008 | Suzuki | G11C 11/413 |
| | | | | 365/154 |
| 2008/0157291 | A1 * | 7/2008 | Li | H01L 21/56 |
| | | | | 257/637 |
| 2008/0180129 | A1 * | 7/2008 | Nabaa | H03K 19/17792 |
| | | | | 326/16 |
| 2008/0252376 | A1 * | 10/2008 | Miao | H03F 1/14 |
| | | | | 330/277 |
| 2009/0154248 | A1 * | 6/2009 | Noda | G11C 11/412 |
| | | | | 365/185.18 |
| 2009/0310398 | A1 * | 12/2009 | Nguyen | G11C 7/12 |
| | | | | 365/156 |
| 2010/0149874 | A1 * | 6/2010 | Leung | G11C 16/02 |
| | | | | 365/185.05 |
| 2010/0264953 | A1 * | 10/2010 | Lilja | G06F 17/5068 |
| | | | | 326/12 |
| 2011/0012105 | A1 * | 1/2011 | Yamazaki | H01L 27/1251 |
| | | | | 257/43 |
| 2011/0018915 | A1 * | 1/2011 | Umezaki | G09G 3/3677 |
| | | | | 345/698 |
| 2011/0031492 | A1 * | 2/2011 | Yamazaki | H01L 27/1225 |
| | | | | 257/43 |
| 2011/0109351 | A1 * | 5/2011 | Yamazaki | H01L 27/1225 |
| | | | | 327/109 |
| 2011/0261631 | A1 * | 10/2011 | Yoshida | G11C 7/02 |
| | | | | 365/189.11 |
| 2011/0317829 | A1 | 12/2011 | Ficke et al. | |
| 2012/0298990 | A1 * | 11/2012 | Yamazaki | H01L 27/1251 |
| | | | | 257/43 |
| 2013/0021864 | A1 * | 1/2013 | Deng | G11C 29/50 |
| | | | | 365/201 |
| 2013/0138407 | A1 * | 5/2013 | Bansal | G06F 17/5036 |
| | | | | 703/2 |
| 2013/0322617 | A1 | 12/2013 | Orshansky | |
| 2014/0157223 | A1 * | 6/2014 | Lilja | G06F 17/5068 |
| | | | | 716/138 |
| 2014/0201851 | A1 | 7/2014 | Guo et al. | |
| 2014/0206133 | A1 * | 7/2014 | Koezuka | H01L 29/66969 |
| | | | | 438/99 |
| 2014/0268994 | A1 | 9/2014 | Rose et al. | |
| 2014/0374908 | A1 * | 12/2014 | Koezuka | H01L 23/53238 |
| | | | | 257/751 |
| 2015/0247892 | A1 * | 9/2015 | Robertazzi | G01R 31/2607 |
| | | | | 324/414 |

OTHER PUBLICATIONS

Han et al.; "Variation-Aware Aging Analysis in Digital ICs"; Year: 201; IEEE Transactions on Very Large Scale Integration (VLSI) Systems; , vol. 21, Issue: 12; pp. 2214-2225.*

Chen et al.; "Graphically Transforming Mueller-Schulz Percolation Criteria to Random Telegraph Signal Magnitudes in Scaled FETs"; Year: 2015; IEEE Electron Device Letters; vol. 36, Issue: 3; pp. 217-219.*

Holcomb et al., "Initial SRAM State as a Fingerprint and Source of True Random Numbers for RFID Tags", Proceedings of the Conference on RFID, Jul. 2007, 12 pages.

Holcomb, "Randomness in Integrated Circuits with Applications in Device Identification and Random Number Generation", Masters Theses 1896—Feb. 2014, Paper 45. Jan. 2007, 58 pages.

Asenov et al., "Intrinsic Threshold Voltage Fluctuations in Decanano MOSFETs Due to Local Oxide Thickness Variations", IEEE Transactions on Electron Devices, vol. 49, No. 1, Jan. 2002, 8 pages.

Rauch, "Review and Reexamination of Reliability Effects Related to NBTI-Induced Statistical Variations", IEEE Transactions on Device and Materials Reliability, vol. 7, Issue 4, Dec. 2007, Abstract, 1 page.

* cited by examiner

CMOS DEVICE WITH READING CIRCUIT

FIELD OF THE INVENTION

The invention relates to integrated circuit chips and, more particularly, to hardware identification systems used in integrated circuit chips.

BACKGROUND

To ensure security and authenticity in a worldwide supply chain, it is necessary to authenticate parts such as integrated circuit chips. Moreover, with the increasing use of electronic devices utilizing integrated circuits to provide different types of information for a variety of different applications, there has been an increasing need to adequately protect sensitive or critical information that may be stored within an electronic device to limit access to such information to only such other devices that have permission to access such information. Some examples of applications include the authentication of devices, protection of confidential information within a device, and securing a communication between two or more devices.

One type of chip identification (ID) utilizes electrical fuses (e-fuses). Typically, such identifiers are formed by providing on-chip fuses and/or anti-fuses, which are programmed (i.e., blown) at test. Blowing fuses and/or anti-fuses at test increases testing time and, thereby, increases chip manufacturing costs. Moreover, e-fuse based systems can be decoded (i.e., read) via failure analysis, and one part can be copied multiple times.

Another type of chip ID is a physically unclonable function (PUF), which is a physical structure typically within an integrated circuit that provides a number of specific outputs or responses in response to specific inputs or challenges to the PUF. Each PUF provides a discrete and unique set of responses to specific challenges, which makes PUFs suitable for use in hiding keying material in semiconductor devices for encrypting confidential information for such devices. A PUF is typically memory based and may comprise, for example, an SRAM power-up based PUF or a DRAM retention based PUF. However, as technology matures in a given node, the memory cells become more stable, which reduces the margins for implementing a PUF.

SUMMARY

In a first aspect of the invention, there is an integrated circuit device including: a first transistor having a first gate oxide thickness; a second transistor having a second gate oxide thickness different than the first gate oxide thickness; and a reading circuit connected to the first transistor and the second transistor, wherein the reading circuit reads a difference in threshold voltage between the first transistor and the second transistor.

In another aspect of the invention, there is an integrated circuit device including an array of cells, wherein each cell includes: a first transistor having a first gate oxide thickness; and a second transistor having a second gate oxide thickness different than the first gate oxide thickness. The device also includes a reading circuit connected to the first transistor and the second transistor of each said cell. The first transistors of the cells of the array have a first threshold voltage distribution having a first mean and a first standard deviation. The second transistors of the cells of the array have a second threshold voltage distribution having a second mean and a second standard deviation. The first mean equals the second mean. The first standard deviation is different than the second standard deviation.

In another aspect of the invention there is a method that includes providing an array of cells, wherein each cell includes: a first transistor having a first gate oxide thickness; a second transistor having a first gate oxide thickness greater than the first gate oxide thickness; and a reading circuit connected to the first transistor and the second transistor, wherein the reading circuit reads a difference in threshold voltage between the first transistor and the second transistor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figures 1, 2:
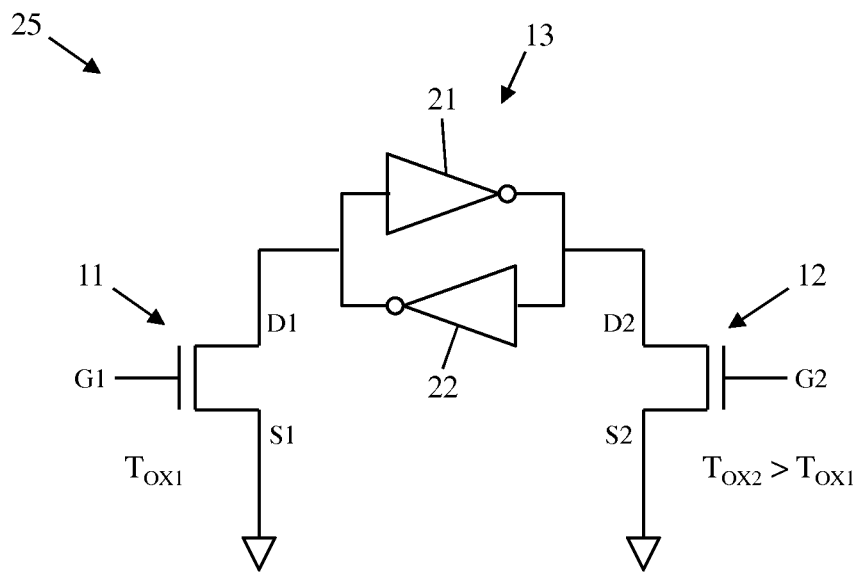
FIG. 1 shows a cell in accordance with aspects of the invention.
FIG. 2 shows an array in accordance with aspects of the invention.

The invention relates to integrated circuit chips and, more particularly, to hardware identification systems used in integrated circuit chips. According to aspects of the invention, a chip ID is provided using an array of transistor pairs that have been programmed using bias temperature instability (BTI). In embodiments, each transistor pair includes first and second transistors that are substantially identical but for a different gate oxide thickness. Specifically, the first and second transistors may each have the same channel length, channel width, and device engineering such that their time-zero threshold voltage distributions are the same or comparable.

The first and second transistors are programmed by subjecting them to voltage and temperature that induces bias temperature instability (BTI) that shifts the respective threshold voltages of the devices. In accordance with aspects of the invention, the programming voltage, time, and temperature are selected such that the first and second transistors each has a same mean in their respective shifted threshold voltage distributions, and such that the first and second transistors have different standard deviations in their respective shifted threshold voltage distributions. Additionally, due to the inherent structural property of the difference in oxide thickness between the first and second transistor, the programming results in different standard deviations in their respective shifted threshold voltage distributions. The first and second transistors are cross coupled with a balanced latch, such that during a subsequent read operation an array of the transistor pairs produces a unique bit string that can be used for chip identification purposes. In this manner, implementations of the invention provide an unclonable chip ID.

Bias temperature instability (BTI) is an instability mechanism that integrated circuit chips experience at high voltage and high temperature, and results in an increased threshold voltage for transistors. BTI can be termed negative bias temperature instability (NBTI), which is a phenomenon that exists in p-type field effect transistors (PFET's) when they are subjected to heating for a given amount of time. NBTI is characterized by an increase in the threshold voltage and a decrease in drain current and transconductance in a PFET. BTI can be termed positive bias temperature instability (PBTI), which is a similar phenomenon that exists in n-type field effect transistors (NFET's). BTI, whether NTBI or PTBI, is normally an undesirable phenomenon. However, aspects of the invention advantageously utilize BTI to program elements of a chip to produce an unclonable chip ID. In contrast to PUF, aspects herein do not rely solely on manufacturing induced variability to identify a chip. Instead, aspects herein leverage a structure and method that uniquely produces different identifiers on different chips (akin to a watermark or fingerprint for each chip), these identifiers being more stable than PUF identification but still remaining unique and secure.

FIG. 1 shows a circuit in accordance with aspects of the invention. The circuit includes a first transistor 11 and a second transistor 12 electrically coupled to a reading circuit 13. The reading circuit 13 is a circuit that reads a difference in threshold voltage between the first transistor 11 and the second transistor 12. In embodiments, the reading circuit 13 comprises a pair of cross-coupled inverters 21 and 22, although other reading circuits may be used to read the difference in threshold voltage between the first transistor 11 and the second transistor 12. Specifically, the cross-coupled inverters 21, 22 are connected to the drain D1 of the first transistor 11 and to the drain D2 of the second transistor 12 as shown in FIG. 1. The respective source S1, S2 of each of first transistor 11 and second transistor 12 is connected to ground. In this manner, the combination of the first transistor 11, second transistor 12, and cross-coupled inverters 21, 22 comprises a cell 25.

As shown in FIG. 2, plural ones of the cells 25 described with respect to FIG. 1 are arranged in an array 30. As described in greater detail herein, the array 30 may be used to implement a physically unclonable function (PUF) that can be used for chip identification and security.

The first transistors 11 of the cells 25 of the array 30 are all essentially identical. Specifically, all the first transistors 11 are manufactured to a same design specification, including: technology (e.g., silicon-on-insulator (SOI)), type (e.g., NFET), a first channel length, a first channel width, and a first gate oxide thickness, and a first design threshold voltage. Although the first transistors 11 are manufactured to be identical, process variations result in differences in the threshold voltages of the transistors in the group. As a result, a first group of first transistors 11 has a threshold voltage probability distribution with a first mean and a first standard deviation.

The second transistors 12 of the cells 25 of the array 30 are all essentially identical. Specifically, all the second transistors 12 are manufactured to a same design specification, including: technology (e.g., SOI), type (e.g., NFET), a second channel length, a second channel width, and a second gate oxide thickness, and a second design threshold voltage. Although the second transistors 12 are manufactured to be identical, process variations result in differences in the threshold voltages of the transistors in the group. As a result, a second group of second transistors 12 has a threshold voltage probability distribution with a second mean and a second standard deviation.

According to aspects of the invention, the first transistors 11 and the second transistors 12 are designed to be substantially identical but for their respective gate oxide thicknesses. That is to say, the first transistors 11 and the second transistors 12 are all of the same technology (e.g., SOI) and type (e.g., NFET) and, in embodiments have a same channel length. In embodiments, the first gate oxide thickness $T_{OX1}$ is different than the second gate oxide thickness $T_{OX2}$. For example, the second gate oxide thickness $T_{OX2}$ may be three times as large as the first gate oxide thickness $T_{OX1}$, although other ratios of first to second gate oxide thickness may be used.

Figure 3:
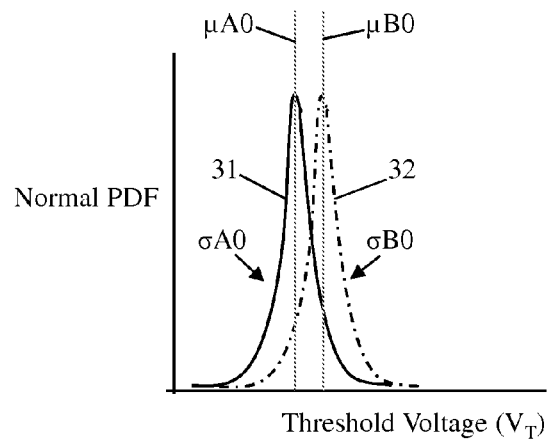
FIGS. 3 and 4 show probability distribution functions in accordance with aspects of the invention.

FIG. 3 shows a plot of a first pre-BTI probability distribution function (PDF) 31 of the threshold voltage of the first group of first transistors 11 and a second pre-BTI probability distribution function (PDF) 32 of the threshold voltage of the second group of second transistors 12. As used herein, pre-BTI may also be referred to as time-zero and means prior to BTI programming as described herein. The first PDF 31 has a first pre-BTI mean $\mu A0$ and a first pre-BTI standard deviation $\sigma A0$. The second PDF 32 has a second pre-BTI mean $\mu B0$ and a second pre-BTI standard deviation $\sigma B0$. In embodiments, the first transistors 11 and the second transistors 12 are designed such that they have the same technology, same type, same channel length, same channel width, different gate oxide thickness, and further such that the first pre-BTI mean $\mu A0$ is the same as (or comparable to) the second pre-BTI mean $\mu B0$, and such that the first pre-BTI standard deviation $\sigma A0$ is the same as (or comparable to) the second pre-BTI standard deviation $\sigma B0$. As used herein, comparable to means within 5% of one another.

According to aspects of the invention, the first transistors 11 and the second transistors 12 described with respect to FIGS. 1-3 are programmed using BTI programming to shift (i.e., change) the threshold voltages of the transistors. In this manner, each of the first transistors 11 is programmed to have a first bias temperature instability (BTI)-shifted threshold voltage, and each of the second transistors 12 is programmed to have a second bias temperature instability (BTI)-shifted threshold voltage. In embodiments, the parameters of the BTI programming are selected to apply desired shifts to the respective threshold voltage distributions of the two groups. Specifically, the transistors are programmed such that the post-BTI threshold voltage distributions of the two groups have a same mean and a different standard deviation relative to one another.

Figure 4:
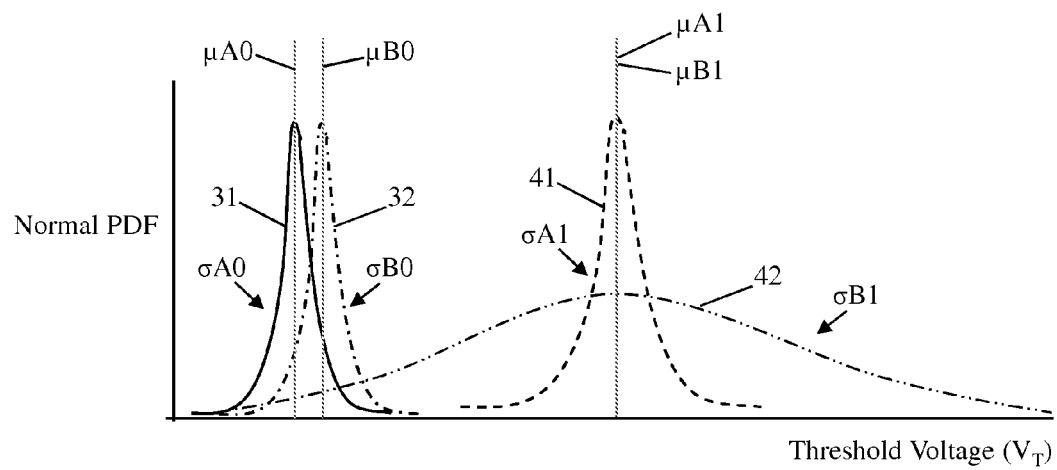

FIG. 4 shows a plot of a first post-BTI probability distribution function (PDF) 41 of the threshold voltage of the first group of first transistors 11 and a second post-BTI probability distribution function (PDF) 42 of the threshold voltage of the second group of second transistors 12. FIG. 4 also shows the first pre-BTI PDF 31 and the second pre-BTI PDF 32 for comparison. As shown in FIG. 4, the threshold voltage distribution of the first group of the first transistors 11 is shifted from the first pre-BTI PDF 31 to the first post-BTI PDF 41, and the threshold voltage distribution of the second group of the second transistors 12 is shifted from the second pre-BTI PDF 32 to the second post-BTI PDF 42. These shifts are accomplished using BTI programming as described herein. As illustrated in FIG. 4, the first post-BTI PDF 41 and the second post-BTI PDF 42 have a same mean $\mu A1 = \mu B1$. As further illustrated in FIG. 4, the first post-BTI PDF 41 has a first post-BTI standard deviation $\sigma A1$ that is different than the second post-BTI standard deviation $\sigma B1$ of the second post-BTI PDF 42.

According to aspects of the invention, the respective shifts of the threshold voltage distributions (depicted in FIG. 4) are achieved by applying respective BTI programming voltages to the first and second transistors of the first and second groups having different gate oxide thicknesses. In embodiments, the BTI programming of a transistor is performed by applying a BTI programming voltage to a gates (G1, G2) of the transistors (11, 12) while the other nodes of the transistor are grounded. The BTI programming voltage may be applied while the transistor is at a programming temperature and for a particular amount of programming time. The magnitudes of the programming voltage, programming temperature, and programming time determine the amount of shift of the threshold voltage of the transistor. Furthermore, as shown below in Equations 1 and 2, the post-programmed threshold voltage mismatch for a group of devices is affected by the gate oxide thickness of the devices:

$$\text{Var}(\Delta \delta V_T) = \frac{K_1 K_0 T_{INV} \text{Mean}(\Delta V_T)}{W \times L} \quad (1)$$

$$K_0 = \frac{2q}{\varepsilon} = \frac{2q}{\varepsilon_{ox}\varepsilon_0} = 9.26 \text{ mV}\mu\text{m} \quad (2)$$

where: Var denotes the variance
δ denotes the mismatch between the paired devices
Δ denotes the difference between time 0 and time 1
$V_T$ denotes threshold voltage
W denotes channel width in um
L denotes channel length in um
$T_{INV}$ denotes gate oxide thickness in um
$K_1$ denotes a technology constant
q denotes charge of electrons
ε denotes electric constant of the material In light of Equations 1 and 2, and with the first transistors 11 having different gate oxide thickness than the second transistors 12, a designer may judiciously select a first programming voltage, first programming temperature, and first programming time to apply to the first transistors 11 and a second programming voltage, second programming temperature, and second programming time to apply to the second transistors 11 in order to achieve the respective shifts depicted in FIG. 4. In an exemplary implementation, the gate oxide thickness of the second transistors is three times the gate oxide thickness of the first transistors, and the BTI programming voltage of the second transistors is greater than the BTI programming voltage of the first transistors. It is the structural difference (i.e., the different gate oxide thicknesses) combined with the different BTI programming that produces the different standard deviations of the shifted threshold voltage distributions. Aspects of the invention are not limited to this example, however, and other combinations of BTI programming parameters (e.g., voltage, temperature, and time) may be used to achieve the desired shifted threshold voltage distributions having the same mean and different standard deviation (e.g., as depicted by PDF 41 and PDF 42).

In an illustrative example, the first transistors 11 and second transistors 12 are all SOI NFET devices having a channel width of 0.054 um and a channel length of 0.055 um. The first transistors 11 have a gate oxide thickness of X, and the first transistors 11 have a gate oxide thickness of 3*X. The first transistors 11 and second transistors 12 have substantially the same pre-BTI threshold voltage distribution with a mean of 0.472 and a standard deviation of 0.0599. The first transistors 11 and second transistors 12 are subjected to the same fast PBTI programming. The PBTI programming shifts the threshold voltage distribution of the first transistors 11 to a post-BTI threshold voltage distribution having a mean of 0.537 and a standard deviation of 0.0623. The PBTI programming shifts the threshold voltage distribution of the second transistors 12 to a post-BTI threshold voltage distribution having a mean of 0.537 and a standard deviation of 0.108. The mean values of the post-BTI (shifted) threshold voltage distributions are the same, while the standard deviations of the post-BTI (shifted) threshold voltage distributions are very different.

After BTI programming the first transistors 11 and second transistors 12 as described herein, a read operation may be performed on each cell by applying a nominal enable voltage to the gate G1 of the first transistor 11 and the gate G2 of the second transistor 12 of the cells. When the enable voltage is applied to a cell in this manner, the cross coupled amplifiers 21, 22 of the cell force an output of the cell to a logic high (1) or logic low (0) state. By programming all the cells of the array in the manner described herein, and by applying a known enable signal to the gates of respective ones of the transistors, the array can be used to generate a unique bit string that can be used for identification purposes, e.g., a finger print database for each product. In this manner, implementations of the invention provide a physically unclonable function (PUF) to be utilized as a chip ID. Advantageously, the chip ID provided by aspects of the invention cannot be located or determined by delayering (e.g., physical inspection, failure analysis) because the variability is mainly due to randomly generated oxide defects. Another advantage provided by aspects of the invention is that a dedicated small array is sufficient to generate a unique chip ID.

Figure 5:
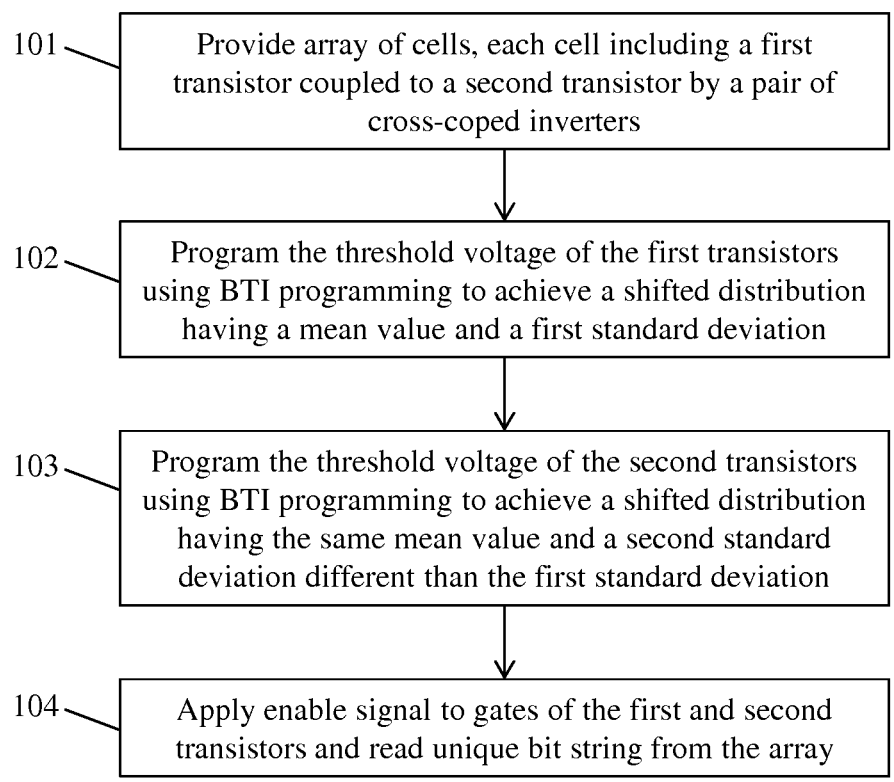
FIG. 5 shows a flow diagram of a method in accordance with aspects of the invention.

FIG. 5 shows a flow diagram of steps of a process in accordance with aspects of the invention. Step 101 includes providing an array of cells with each of the cells including a first transistor coupled to a second transistor by a pair of cross-coped inverters. Step 101 may correspond to array 30 of cells 25 as described with respect to FIGS. 1 and 2. Step 102 includes programming the threshold voltage of the first transistors using BTI programming to achieve a shifted distribution having a mean value and a first standard deviation. Step 103 includes programming the threshold voltage of the second transistors using BTI programming to achieve a shifted distribution having the same mean value and a second standard deviation different than the first standard deviation. Steps 102 and 103 may be performed in the manner described with respect to FIGS. 3 and 4. Step 104 includes applying an enable signal to gates of the first and second transistors and read unique bit string from the array.

Figure 6:
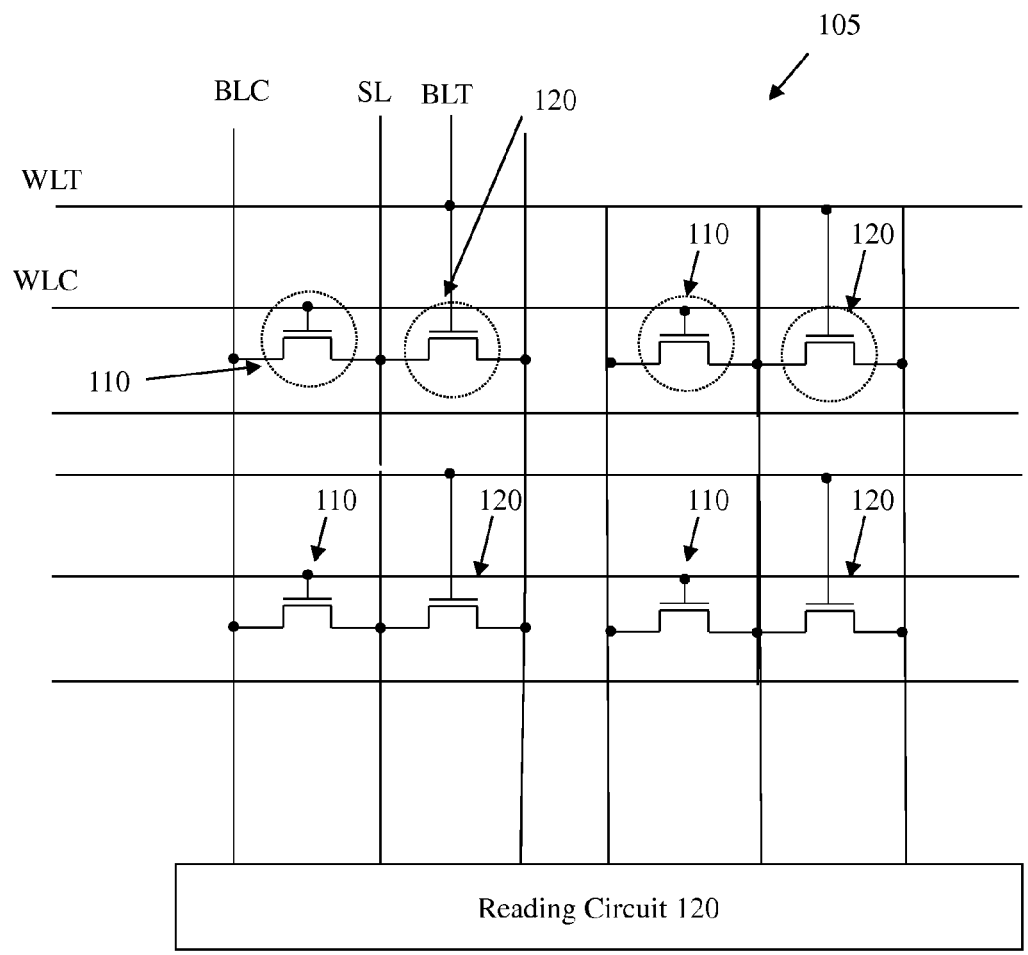
FIG. 6 shows an alternative embodiment of an array in accordance with aspects of the invention.

FIG. 6 shows an alternate embodiment of an array in accordance with aspects of the invention. As shown in FIG. 6, an array 105 comprises of an array of pairs of devices, transistors 110 and transistors 120, arranged in a two-dimensional matrix. Each transistor 110 has a first oxide thickness, and each transistor 120 has a second oxide thickness greater than the first oxide thickness. All gates of all transistors 110 are connected to WLC, and all gates of all transistors 120 are connected to WLT. To program the array 105, WLT is raised to a set voltage, typically 2 V, while WLC is held to a lower voltage, typically 1.5 V. The choice in the exact voltage values and the time of programming can be optimized for different technologies. This programming induces a BTI shift in the threshold voltage of both transistors 110 and 120 in the manner described with respect to FIG. 4. The difference in the threshold voltages between transistor 110 and transistor 120 of a given transistor pair is read by a reading circuit 120.

The circuits of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit device, comprising:
a first transistor having a first gate oxide thickness;
a second transistor having a second gate oxide thickness different than the first gate oxide thickness; and
a reading circuit connected to the first transistor and the second transistor, wherein the reading circuit reads a difference in threshold voltage between the first transistor and the second transistor, and the reading circuit comprises a first inverter and a second inverter cross-coupled between the first transistor and the second transistor.

2. The device of claim 1, wherein:
the first transistor has a first bias temperature instability (BTI)-shifted threshold voltage; and
the second transistor has a second BTI-shifted threshold voltage.

3. The device of claim 2, the first transistor and the second transistor have a same channel length and a same channel width.

4. The device of claim 1, wherein:
the first transistor is included in a first group of transistors; and
a distribution of BTI-shifted threshold voltage of the first group of transistors has a first mean and a first standard deviation;
the second transistor is included in a second group of transistors;
a distribution of BTI-shifted threshold voltage of the second group of transistors has a second mean and a second standard deviation;
the first mean equals the second mean; and
the first standard deviation is different than the second standard deviation.

5. The device of claim 1, wherein:
a drain of the first transistor is connected to an output of the first inverter and an input of the second inverter; and
a drain of the second transistor is connected to an input of the first inverter and an output of the second inverter.

6. An integrated circuit device, comprising:
an array of cells, wherein each cell comprises:
a first transistor having a first gate oxide thickness; and
a second transistor having a second gate oxide thickness different than the first gate oxide thickness; and
a reading circuit connected to the first transistor and the second transistor of each said cell, the reading circuit comprising a first inverter and a second inverter cross-coupled between the first transistor and the second transistor,
wherein the first transistors of the cells of the array have a first threshold voltage distribution having a first mean and a first standard deviation;
the second transistors of the cells of the array have a second threshold voltage distribution having a second mean and a second standard deviation;
the first mean equals the second mean; and
the first standard deviation is different than the second standard deviation.

7. The device of claim 6, wherein:
the first threshold voltage distribution is a first post-BTI distribution that is shifted from a pre-BTI distribution of the first transistors of the cells of the array; and
the second threshold voltage distribution is a second post-BTI distribution that is shifted from a pre-BTI distribution of the second transistors of the cells of the array.

8. The device of claim 6, wherein in each of the cells:
the second gate oxide thickness is greater than the first gate oxide thickness;
a drain of the first transistor is connected to an output of the first inverter and an input of the second inverter; and
a drain of the second transistor is connected to an input of the first inverter and an output of the second inverter.

9. The device of claim 8, wherein:
the first transistors of the cells of the array and the second transistors of the cells of the array have a same channel length and a same channel width; and
the first transistors of the cells of the array and the second transistors of the cells of the array are silicon-on-insulator n-type field effect transistors.

10. The device of claim 6, the cells of the array are arranged such that applying an enable voltage to gates of the first transistors and the second transistors produces a unique bit string.

11. A method of manufacturing a memory device, comprising:
forming an array of cells, wherein each cell comprises:
a first transistor having a first gate oxide thickness;
a second transistor having a first gate oxide thickness greater than the first gate oxide thickness; and a reading circuit connected to the first transistor and the second transistor, wherein the reading circuit reads a difference in threshold voltage between the first transistor and the second transistor, and the reading circuit comprises a first inverter and a second inverter cross-coupled between the first transistor and the second transistor.

12. The method of claim 11, further comprising:
programming the first transistors to shift a distribution of threshold voltages of the first transistors from a first pre-BTI distribution to a first post-BTI distribution; and
programming the second transistors to shift a distribution of threshold voltages of the second transistors from a second pre-BTI distribution to a second post-BTI distribution.

13. The method of claim 12, wherein:
a mean of the first post-BTI distribution equals a mean of the second post-BTI distribution; and
a standard deviation of the first post-BTI distribution is different than a standard deviation of the second post-BTI distribution.

14. The method of claim 13, wherein:
a mean of the first pre-BTI distribution equals a mean of the second pre-BTI distribution; and
a standard deviation of the first pre-BTI distribution equals a standard deviation of the second pre-BTI distribution.

15. The method of claim 13, wherein:
a mean of the first pre-BTI distribution is comparable to a mean of the second pre-BTI distribution; and
a standard deviation of the first pre-BTI distribution is comparable to a standard deviation of the second pre-BTI distribution.

16. The method of claim 12, wherein:
the programming the first transistors is performed at a first programming voltage and a first programming temperature for a first programming time;
the programming the second transistors is performed at a second programming voltage and a second programming temperature for a second programming time; and
at least one of:
the second programming voltage is greater than the first programming voltage;
the second programming temperature is greater than the first programming temperature; and
the second programming time is greater than the first programming time.

17. The method of claim 11, further comprising:
programming the first transistors of the cells of the array using a first bias temperature instability (BTI) programming voltage; and
programming the second transistors of the cells of the array using a second bias temperature instability (BTI) programming voltage.

18. The method of claim 17, the first transistors of the cells of the array and the second transistors of the cells of the array have a same channel length and a same channel width.

19. The method of claim 18, wherein in each of the cells:
a drain of the first transistor is connected to an output of the first inverter and an input of the second inverter;
a drain of the second transistor is connected to an input of the first inverter and an output of the second inverter;
a source of the first transistor is connected to ground; and
a source of the second transistor is connected to ground.

20. The method of claim 11, further comprising reading a unique bit string from the cells of the array based on applying an enable voltage to gates of the first transistors and the second transistors.

* * * * *